US009286143B2

(12) United States Patent  (10) Patent No.: US 9,286,143 B2
Carey et al.  (45) Date of Patent: Mar. 15, 2016

(54) FLEXIBLE EVENT DATA CONTENT MANAGEMENT FOR RELEVANT EVENT AND ALERT ANALYSIS WITHIN A DISTRIBUTED PROCESSING SYSTEM

(71) Applicant: INTERNATIONAL BUSINESS MACHINES CORPORATION, Armonk, NY (US)

(72) Inventors: James E. Carey, Rochester, MN (US); Matthew W. Markland, Rochester, MN (US); Philip J. Sanders, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 13/678,153

(22) Filed: Nov. 15, 2012

(65) Prior Publication Data

US 2013/0074102 A1   Mar. 21, 2013

Related U.S. Application Data

(63) Continuation of application No. 13/166,470, filed on Jun. 22, 2011.

(51) Int. Cl.
G06F 9/46 (2006.01)
G06F 9/54 (2006.01)
(52) U.S. Cl.
CPC ..................................... G06F 9/542 (2013.01)
(58) Field of Classification Search
None
See application file for complete search history.

(56) References Cited

U.S. PATENT DOCUMENTS 4,812,852 A   3/1989 Bent et al.
4,823,261 A   4/1989 Bank et al.
(Continued)

FOREIGN PATENT DOCUMENTS

CN   101026494   8/2007
CN   101739745   6/2010
(Continued)

OTHER PUBLICATIONS

Cottrell, et al., "Distributed Computing Environment Monitoring and User Expectations,", CHEP95 Conference, Sep. 1995, pp. 1-29, SLAC, Rio de Janeiro.

(Continued)

*Primary Examiner* — Umut Onat
(74) *Attorney, Agent, or Firm* — Edward J. Lenart; Grant A. Johnson; Kennedy Lenart Spraggins LLP

(57) ABSTRACT

Methods, systems, and computer program products for flexible event data content management for relevant event and alert analysis within a distributed processing system are provided. Embodiments include capturing, by an interface connector, an event from a resource of the distributed processing system; inserting, by the interface connector, the event into an event database; receiving from the interface connector, by a notifier, a notification of insertion of the event into the event database; based on the received notification, tracking, by the notifier, the number of events indicated as inserted into the event database; receiving from the notifier, by a monitor, a cumulative notification indicating the number of events that have been inserted into the event database; in response to receiving the cumulative notification, retrieving, by the monitor, from the event database, events inserted into the event database; and processing, by the monitor, the retrieved events.

8 Claims, 8 Drawing Sheets

(56) References Cited

U.S. PATENT DOCUMENTS

| | | | |
|---|---|---|---|
| 4,965,772 A | 10/1990 | Daniel et al. | |
| 5,119,377 A | 6/1992 | Cobb et al. | |
| 5,276,861 A | 1/1994 | Howarth | |
| 5,515,285 A | 5/1996 | Garrett et al. | |
| 5,535,380 A | 7/1996 | Bergkvist et al. | |
| 5,581,242 A | 12/1996 | Arita et al. | |
| 5,689,636 A | 11/1997 | Kleber et al. | |
| 5,777,549 A | 7/1998 | Arrowsmith et al. | |
| 5,991,881 A | 11/1999 | Conklin et al. | |
| 6,094,681 A | 7/2000 | Shaffer et al. | |
| 6,255,943 B1 | 7/2001 | Lewis et al. | |
| 6,314,533 B1 | 11/2001 | Novik et al. | |
| 6,373,383 B1 | 4/2002 | Arrowsmith et al. | |
| 6,401,116 B1 | 6/2002 | Okigami et al. | |
| 6,405,250 B1 | 6/2002 | Lin et al. | |
| 6,446,136 B1 | 9/2002 | Pohlmann et al. | |
| 6,446,224 B1 | 9/2002 | Chang et al. | |
| 6,513,129 B1 | 1/2003 | Tentij et al. | |
| 6,539,335 B1 | 3/2003 | Morris | |
| 6,594,786 B1 | 7/2003 | Connelly et al. | |
| 6,606,610 B1 | 8/2003 | Gray et al. | |
| 6,631,409 B1 | 10/2003 | Watson et al. | |
| 6,704,874 B1 | 3/2004 | Porras et al. | |
| 6,708,288 B1 | 3/2004 | Ziegler et al. | |
| 6,754,854 B2 | 6/2004 | Kurrasch | |
| 6,801,927 B1 | 10/2004 | Smith et al. | |
| 6,871,349 B1 | 3/2005 | Akhond et al. | |
| 6,889,169 B2 | 5/2005 | Kirshenbaum et al. | |
| 6,915,285 B2 | 7/2005 | Gray et al. | |
| 6,918,059 B1 | 7/2005 | Galuten et al. | |
| 6,925,586 B1 | 8/2005 | Perrella et al. | |
| 6,988,208 B2 | 1/2006 | Hrabik et al. | |
| 6,990,601 B1 | 1/2006 | Tsuneya et al. | |
| 7,043,659 B1 | 5/2006 | Klein et al. | |
| 7,117,391 B1 | 10/2006 | Hornick et al. | |
| 7,213,179 B2 | 5/2007 | Song et al | |
| 7,251,584 B1 | 7/2007 | Perazolo et al. | |
| 7,251,826 B1 | 7/2007 | Gardos et al. | |
| 7,251,829 B1 | 7/2007 | Pagdin et al. | |
| 7,263,553 B2 | 8/2007 | Gaspard | |
| 7,281,172 B2 | 10/2007 | Chujo | |
| 7,289,988 B2 | 10/2007 | Joseph | |
| 7,299,152 B1 | 11/2007 | Moritz | |
| 7,430,692 B2 | 9/2008 | White et al. | |
| 7,457,805 B2 | 11/2008 | Deen et al. | |
| 7,469,239 B2 | 12/2008 | Musman | |
| 7,568,027 B2 | 7/2009 | Becker et al. | |
| 7,599,359 B1 | 10/2009 | Croak et al. | |
| 7,603,711 B2 | 10/2009 | Scheidell | |
| 7,606,891 B1 | 10/2009 | Shyu et al. | |
| 7,613,741 B2 | 11/2009 | Lu et al. | |
| 7,617,074 B2 | 11/2009 | Beish et al. | |
| 7,673,335 B1 | 3/2010 | Chakravarty et al. | |
| 7,687,066 B2 | 3/2010 | Fujino et al. | |
| 7,702,782 B1 | 4/2010 | Pai | |
| 7,756,053 B2 | 7/2010 | Thomas et al. | |
| 7,792,042 B2 | 9/2010 | Golla et al. | |
| 7,815,103 B2 | 10/2010 | Timmis et al. | |
| 7,822,848 B2 | 10/2010 | Muller et al. | |
| 7,872,982 B2 | 1/2011 | Atkins et al. | |
| 7,904,319 B1 | 3/2011 | Whear et al. | |
| 7,954,159 B2 | 5/2011 | Hrabik et al. | |
| 7,979,355 B2 | 7/2011 | Shah et al. | |
| 7,984,452 B2 | 7/2011 | Chakravarty et al. | |
| 7,996,046 B2 | 8/2011 | Vargas et al. | |
| 8,020,045 B2 | 9/2011 | Morimura et al. | |
| 8,041,799 B1 | 10/2011 | Usery et al. | |
| 8,135,863 B2 | 3/2012 | Nekovee et al. | |
| 8,248,228 B2 | 8/2012 | Hollender | |
| 8,314,694 B2 | 11/2012 | Naedele et al. | |
| 8,321,865 B2 | 11/2012 | Amini et al. | |
| 8,347,143 B2 | 1/2013 | Atkins et al. | |
| 8,350,681 B2 | 1/2013 | Bells | |
| 8,364,813 B2 | 1/2013 | Atkins et al. | |
| 8,380,838 B2 | 2/2013 | Bose et al. | |
| 8,386,602 B2 | 2/2013 | Carey et al. | |
| 8,417,809 B1 | 4/2013 | Lancaster et al. | |
| 8,418,247 B2 | 4/2013 | Sinnaya et al. | |
| 8,458,530 B2 | 6/2013 | Kini et al. | |
| 8,495,661 B2 | 7/2013 | Carey et al. | |
| 8,676,883 B2 | 3/2014 | Atkins et al. | |
| 8,688,769 B2 | 4/2014 | Atkins et al. | |
| 8,737,231 B2 | 5/2014 | Carey et al. | |
| 8,769,096 B2 | 7/2014 | Carey et al. | |
| 8,775,917 B2 | 7/2014 | Bourke et al. | |
| 8,825,836 B1 | 9/2014 | Gibson et al. | |
| 8,832,219 B2 | 9/2014 | Morgan | |
| 8,856,807 B1* | 10/2014 | Khapre et al. | 719/318 |
| 8,868,986 B2 | 10/2014 | Carey et al. | |
| 8,959,063 B2 | 2/2015 | Haeberle et al. | |
| 8,966,505 B1 | 2/2015 | Neilan | |
| 2001/0055963 A1 | 12/2001 | Cloutier | |
| 2002/0016871 A1 | 2/2002 | Graf | |
| 2002/0077836 A1 | 6/2002 | Elnozahy et al. | |
| 2002/0095595 A1 | 7/2002 | Christopherson et al. | |
| 2003/0026525 A1 | 2/2003 | Alvarez | |
| 2003/0061514 A1 | 3/2003 | Bardsley et al. | |
| 2003/0200187 A1 | 10/2003 | Gray et al. | |
| 2004/0030531 A1 | 2/2004 | Miller et al. | |
| 2004/0153693 A1 | 8/2004 | Fisher et al. | |
| 2004/0181294 A1 | 9/2004 | Deitz et al. | |
| 2004/0221025 A1 | 11/2004 | Johnson et al. | |
| 2004/0243905 A1 | 12/2004 | Merritt | |
| 2005/0010545 A1 | 1/2005 | Joseph | |
| 2005/0034130 A1 | 2/2005 | Skovira | |
| 2005/0034134 A1 | 2/2005 | Lieblich | |
| 2005/0183093 A1 | 8/2005 | Pope et al. | |
| 2005/0193285 A1 | 9/2005 | Jeon | |
| 2005/0210331 A1 | 9/2005 | Connelly et al. | |
| 2005/0240547 A1 | 10/2005 | Gray et al. | |
| 2005/0246288 A1 | 11/2005 | Kimura et al. | |
| 2006/0015608 A1 | 1/2006 | Becker et al. | |
| 2006/0020942 A1 | 1/2006 | Ly et al. | |
| 2006/0085724 A1 | 4/2006 | Merritt | |
| 2006/0129947 A1 | 6/2006 | Hamzy et al. | |
| 2006/0168185 A1 | 7/2006 | McCall et al. | |
| 2006/0174251 A1 | 8/2006 | Pope et al. | |
| 2006/0271784 A1 | 11/2006 | Bolosky et al. | |
| 2006/0282419 A1 | 12/2006 | Sen et al. | |
| 2007/0002736 A1 | 1/2007 | Gade et al. | |
| 2007/0033594 A1 | 2/2007 | Allen et al. | |
| 2007/0037521 A1 | 2/2007 | Babut et al. | |
| 2007/0073708 A1 | 3/2007 | Smith et al. | |
| 2007/0088755 A1 | 4/2007 | Nesbitt et al. | |
| 2007/0100959 A1 | 5/2007 | Eichstaedt et al. | |
| 2007/0100960 A1 | 5/2007 | Eichstaedt et al. | |
| 2007/0124437 A1 | 5/2007 | Chervets | |
| 2007/0136237 A1 | 6/2007 | Barker et al. | |
| 2007/0174768 A1 | 7/2007 | Sen et al. | |
| 2007/0177523 A1 | 8/2007 | Nagami et al. | |
| 2007/0180103 A1 | 8/2007 | Atkins et al. | |
| 2007/0222576 A1 | 9/2007 | Miller et al. | |
| 2007/0294399 A1 | 12/2007 | Grossner et al. | |
| 2008/0071403 A1 | 3/2008 | Conway et al. | |
| 2008/0080384 A1 | 4/2008 | Atkins et al. | |
| 2008/0109683 A1 | 5/2008 | Erwin et al. | |
| 2008/0155360 A1 | 6/2008 | Bates et al. | |
| 2008/0196044 A1 | 8/2008 | Stanley | |
| 2008/0228787 A1 | 9/2008 | Merritt | |
| 2008/0235365 A1 | 9/2008 | Bansal et al. | |
| 2008/0284581 A1 | 11/2008 | Sheleheda et al. | |
| 2009/0006883 A1 | 1/2009 | Zhang et al. | |
| 2009/0070785 A1 | 3/2009 | Alvez et al. | |
| 2009/0077224 A1 | 3/2009 | Appleton | |
| 2009/0094649 A1 | 4/2009 | Patel | |
| 2009/0183037 A1 | 7/2009 | Hamaguchi et al. | |
| 2009/0199051 A1 | 8/2009 | Jann et al. | |
| 2009/0216881 A1 | 8/2009 | Lovy et al. | |
| 2009/0275807 A1 | 11/2009 | Sitzman et al. | |
| 2009/0292948 A1 | 11/2009 | Cinato et al. | |
| 2009/0327429 A1 | 12/2009 | Hughes et al. | |
| 2009/0328044 A1 | 12/2009 | Bergheaud et al. | |
| 2010/0019894 A1 | 1/2010 | Okada | |
| 2010/0031354 A1 | 2/2010 | Hudis et al. | |

(56) References Cited

U.S. PATENT DOCUMENTS

| | | |
|---|---|---|
| 2010/0042632 A1 | 2/2010 | Johnson et al. |
| 2010/0083382 A1 | 4/2010 | Farley et al. |
| 2010/0180150 A1 | 7/2010 | Jeddeloh |
| 2010/0192163 A1 | 7/2010 | Pope et al. |
| 2010/0211192 A1 | 8/2010 | Stluka et al. |
| 2010/0211952 A1 | 8/2010 | Kasravi et al. |
| 2010/0287615 A1 | 11/2010 | Martin et al. |
| 2010/0332918 A1 | 12/2010 | Harnois |
| 2011/0078519 A1 | 3/2011 | Yordanov et al. |
| 2011/0106941 A1 | 5/2011 | Franklin |
| 2011/0119372 A1 | 5/2011 | Rodrigues et al. |
| 2011/0122773 A1 | 5/2011 | Kung et al. |
| 2011/0145659 A1 | 6/2011 | Ikeyama |
| 2011/0161130 A1 | 6/2011 | Whalin et al. |
| 2011/0167112 A1 | 7/2011 | Mazzucco et al. |
| 2011/0193704 A1 | 8/2011 | Harper et al. |
| 2011/0200304 A1 | 8/2011 | Rutledge |
| 2011/0275356 A1 | 11/2011 | Best et al. |
| 2011/0289433 A1 | 11/2011 | Whalin et al. |
| 2012/0084432 A1 | 4/2012 | Soprovich et al. |
| 2012/0110153 A1 | 5/2012 | Atkins et al. |
| 2012/0110161 A1 | 5/2012 | Carey et al. |
| 2012/0110600 A1 | 5/2012 | Carey et al. |
| 2012/0143875 A1 | 6/2012 | Sarma et al. |
| 2012/0144020 A1 | 6/2012 | Carey et al. |
| 2012/0144021 A1 | 6/2012 | Carey et al. |
| 2012/0144243 A1 | 6/2012 | Carey et al. |
| 2012/0144251 A1 | 6/2012 | Carey et al. |
| 2012/0239973 A1 | 9/2012 | Walton et al. |
| 2012/0275456 A1 | 11/2012 | Ammireddy |
| 2012/0303815 A1 | 11/2012 | Atkins et al. |
| 2012/0304012 A1 | 11/2012 | Atkins et al. |
| 2012/0304013 A1 | 11/2012 | Atkins et al. |
| 2012/0304022 A1 | 11/2012 | Carey et al. |
| 2012/0330918 A1 | 12/2012 | Carey et al. |
| 2012/0331332 A1 | 12/2012 | Carey et al. |
| 2012/0331347 A1 | 12/2012 | Carey et al. |
| 2012/0331485 A1 | 12/2012 | Carey et al. |
| 2013/0073726 A1 | 3/2013 | Carey et al. |
| 2013/0074102 A1 | 3/2013 | Carey et al. |
| 2013/0080630 A1 | 3/2013 | Carey et al. |
| 2013/0091386 A1 | 4/2013 | Atkins et al. |
| 2013/0097215 A1 | 4/2013 | Atkins et al. |
| 2013/0097216 A1 | 4/2013 | Carey et al. |
| 2013/0097272 A1 | 4/2013 | Atkins et al. |
| 2013/0097300 A1 | 4/2013 | Atkins et al. |
| 2013/0097310 A1 | 4/2013 | Carey et al. |
| 2013/0097619 A1 | 4/2013 | Carey et al. |
| 2013/0097620 A1 | 4/2013 | Carey et al. |
| 2013/0111502 A1 | 5/2013 | Carey et al. |
| 2013/0132460 A1 | 5/2013 | Atkins et al. |
| 2013/0138809 A1 | 5/2013 | Carey et al. |
| 2013/0144932 A1 | 6/2013 | Atkins et al. |
| 2013/0166743 A1 | 6/2013 | Carey et al. |
| 2013/0179905 A1 | 7/2013 | Atkins et al. |
| 2013/0290554 A1 | 10/2013 | Chen et al. |
| 2013/0305103 A1 | 11/2013 | Carey et al. |
| 2013/0318404 A1 | 11/2013 | Carey et al. |
| 2014/0040673 A1 | 2/2014 | Carey et al. |
| 2014/0047273 A1 | 2/2014 | Carey et al. |
| 2014/0068347 A1 | 3/2014 | Carey et al. |
| 2014/0101307 A1 | 4/2014 | Carey et al. |
| 2014/0172938 A1 | 6/2014 | Carey et al. |
| 2014/0214896 A1 | 7/2014 | Hotta et al. |
| 2015/0033243 A1 | 1/2015 | Carey et al. |
| 2015/0058657 A1 | 2/2015 | Archer et al. |
| 2015/0058676 A1 | 2/2015 | Boger et al. |
| 2015/0074164 A1 | 3/2015 | Boger et al. |
| 2015/0074472 A1 | 3/2015 | Boger et al. |
| 2015/0149630 A1 | 5/2015 | Atkins et al. |
| 2015/0193295 A1 | 7/2015 | Boger |
| 2015/0195165 A1 | 7/2015 | Boger |

FOREIGN PATENT DOCUMENTS

| | | |
|---|---|---|
| JP | 2007094997 | 4/2007 |
| JP | 2007094997 A | 4/2007 |

OTHER PUBLICATIONS

Sundstrom, et al., "SNA: Current Requirements and Direction," IBM Systems Journal, vol. 26, No. 1 1987, pp. 13-36, IBM Communication Products Division, Research Triangle Park, North Carolina USA.

Carey et al., "A Toolkit for Event Analysis and Logging", SC'11, Nov. 12, 2011, pp. 1-7, ACM, Seattle, Washington.

Author: Qin Zhao, Rodic Rabbah, Weng-Fai Wong Title: Dynamic memory optimization using pool allocation and prefetching Date: Dec. 2005 Publisher: ACM SIGARCH computer architecture news, vol. 33, Issue 5, pp. 27-32.

Office Action, U.S. Appl. No. 12/961,687, Nov. 8, 2012.
Office Action, U.S. Appl. No. 12/962,217, Oct. 10, 2012.
Office Action, U.S. Appl. No. 12/938,052, Oct. 15, 2012.
Notice of Allowance, U.S. Appl. No. 12/938,084, Oct. 23, 2012.
Office Action, U.S. Appl. No. 13/117,341, Dec. 12, 2012.
Notice of Allowance, U.S. Appl. No. 13/166,013, Oct. 29, 2012.
Office Action, U.S. Appl. No. 13/275,487, Feb. 25, 2014.
Office Action, U.S. Appl. No. 13/710,523, Mar. 3, 2014.
Office Action, U.S. Appl. No. 13/570,819, Apr. 30, 2014.
Zhao, Q., et al., "Dynamic Memory Optimization using Pool Allocation and Prefetching", ACM SIGARCH Computer Architecture News, Dec. 2005, pp. 27-32, vol. 33, No. 5, ACM, New York, NY, USA.
Notice of Allowance, U.S. Appl. No. 12/960,990, Aug. 26, 2013.
Office Action, U.S. Appl. No. 12/962,265, Sep. 20, 2013.
Final Office Action, U.S. Appl. No. 12/961,687, Oct. 7, 2013.
Office Action, U.S. Appl. No. 13/117,371, Sep. 27, 2013.
Notice of Allowance, U.S. Appl. No. 13/114,463, Oct. 10, 2013.
Final Office Action, U.S. Appl. No. 13/117,341, Jul. 16, 2013.
Notice of Allowance, U.S. Appl. No. 13/117,341, Oct. 25, 2013.
Final Office Action, U.S. Appl. No. 13/166,470, Oct. 16, 2013.
Final Office Action, U.S. Appl. No. 13/166,027 Sep. 26, 2013.
Office Action, U.S. Appl. No. 13/166,027, May 3, 2013.
Office Action, U.S. Appl. No. 13/166,397, Jul. 2, 2013.
Notice of Allowance, U.S. Appl. No. 13/116,382, Sep. 16, 2013.
Office Action, U.S. Appl. No. 13/116,382, May 9, 2013.
Office Action, U.S. Appl. No. 13/282,995, Jul. 17, 2013.
Notice of Allowance, U.S. Appl. No. 13/275,467, Aug. 23, 2013.
Office Action, U.S. Appl. No. 13/275,487, Aug. 16, 2013.
Notice of Allowance, U.S. Appl. No. 13/275,500, Aug. 7, 2013.
Office Action, U.S. Appl. No. 13/275,500, May 1, 2013.
Final Office Action, U.S. Appl. No. 13/275,530, Jul. 25, 2013.
Office Action, U.S. Appl. No. 13/663,031, Sep. 20, 2013.
Notice of Allowance, U.S. Appl. No. 16/661,930, Aug. 27, 2013.
Office Action, U.S. Appl. No. 13/676,405, Aug. 30, 2013.
Notice of Allowance, U.S. Appl. No. 13/672,966, Oct. 1, 2013.
Office Action, U.S. Appl. No. 13/688,603, Sep. 27, 2013.
Final Office Action, U.S. Appl. No. 13/677,970, Aug. 16, 2013.
Office Action, U.S. Appl. No. 13/672,044, Jul. 5, 2013.
Notice of Allowance, U.S. Appl. No. 13/706,574, Jun. 4, 2013.
Notice of Allowance, U.S. Appl. No. 13/742,325, Aug. 28, 2013.
Office Action, U.S. Appl. No. 13/742,325, Apr. 25, 2013.
Office Action, U.S. Appl. No. 13/710,523, Aug. 20, 2013.
Notice of Allowance, U.S. Appl. No. 13/738,043, Oct. 28, 2013.
Office Action, U.S. Appl. No. 13/738,043, Sep. 5, 2013.
Final Office Action, U.S. Appl. No. 13/708,061, Jul. 25, 2013.
Office Action, U.S. Appl. No. 13/747,895, Oct. 11, 2013.
Office Action, U.S. Appl. No. 13/776,823, Oct. 11, 2013.
Interlink Software Services, "Business Enterprise Server User Guide", Jun. 20, 2012, pp. 1-506, Version 3.5, Interlink Software Services, Ltd., Manchester, UK.
Sourceforge, "HowTo—Event Analyzer",—sourceforge.net (online), Nov. 6, 2012, [accessed Apr. 15, 2013], 4 pages, URL: http://sourceforge.net/apps/mediawiki/pyteal/index.php?title=HowTo_—_Event_Analyzer#Checkpoint_support.

(56) References Cited

OTHER PUBLICATIONS

Splunk Inc., "Splunk Hadoop Connect", splunk.com (online), 2 pp., [accessed May 15, 2013], URL: http://www.splunk.com/view/hadoop-connect/SP-CAAAHA3.

Brown, "Using Hadoop to Process aTrillion+ Events", Presentation, Mar. 2012, 29 pp., comScore, Inc., (online), URL: http://www.slideshare.net/Hadoop_Summit/analyzing-14-trillion-events-with-hadoop.

Kimball, "Real-time Streaming Analysis for Hadoop and Flume", Open Source Data Convention (OSCON), Jul. 2011, 24 pp., oscon.com (online), URL: http://cdn.oreillystatic.com/en/assets/1/event/61/Real-time%20Streaming%20Analysis%20for%20Hadoop%20-and%20Flume%20Presentation.pdf.

Manku, et al., "Approximate Frequency Counts over Data Streams", Proceedings of the 28th VLDB Conference (28th VLDB), pp. 346-357, Aug. 2002, Morgan Kaufmann, San Francisco, CA.

Final Office Action, U.S. Appl. No. 13/117,371, May 22, 2014.
Office Action, U.S. Appl. No. 13/166,470, Jul. 21, 2014.
Office Action, U.S. Appl. No. 13/275,530, May 23, 2014.
Office Action, U.S. Appl. No. 13/567,601, May 23, 2014.
Final Office Action, U.S. Appl. No. 13/688,603, Jun. 26, 2014.
Office Action, U.S. Appl. No. 12/960,990, Mar. 20, 2013.
Final Office Action, U.S. Appl. No. 12/962,217, Apr. 11, 2013.
Notice of Allowance, U.S. Appl. No. 12/938,052, Mar. 28, 2013.
Office Action, U.S. Appl. No. 13/117,371, Apr. 9, 2013.
Office Action, U.S. Appl. No. 13/114,463, Mar. 21, 2013.
Office Action, U.S. Appl. No. 13/16,470, Mar. 27, 2013.
Office Action, U.S. Appl. No. 13/275,467, Jan. 16, 2013.
Office Action, U.S. Appl. No. 13/275,530, Mar. 21, 2013.
Office Action, U.S. Appl. No. 13/661,930, Mar. 20, 2013.
Office Action, U.S. Appl. No. 13/672,966, Feb. 6, 2013.
Office Action, U.S. Appl. No. 13/688,603, Apr. 4, 2013.
Notice of Allowance, U.S. Appl. No. 13/679,219, Apr. 4, 2013.
Office Action, U.S. Appl. No. 13/706,574, Feb. 25, 2013.
Office Action, U.S. Appl. No. 13/708,061, Mar. 21, 2013.
Office Action, U.S. Appl. No. 13/166,103, Jun. 29, 2012.
Office Action, U.S. Appl. No. 13/166,470, Mar. 27, 2013.

* cited by examiner

FLEXIBLE EVENT DATA CONTENT MANAGEMENT FOR RELEVANT EVENT AND ALERT ANALYSIS WITHIN A DISTRIBUTED PROCESSING SYSTEM

CROSS-REFERENCE TO RELATED APPLICATION

This application is a continuation application of and claims priority from U.S. patent application Ser. No. 13/166,470, filed on Jun. 22, 2011.

STATEMENT REGARDING FEDERALLY SPONSORED RESEARCH OR DEVELOPMENT

This invention was made with Government support under Contract No. HR0011-07-9-0002 awarded by DARPA. The Government has certain rights in this invention.

BACKGROUND OF THE INVENTION

1. Field of the Invention

The field of the invention is data processing, or, more specifically, methods, systems, and products for flexible event data content management for relevant event and alert analysis within a distributed processing system.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Modern distributed processing systems for intensive computing may have millions of devices with many processes running on each device all of which are capable of error and status reporting for automated error recovery, reporting to a systems administrator, and for other reasons. In many cases, in the case of an error for example, the sheer number of such error reports and status reports are so overwhelming that they cannot be handled in a meaningful manner. For example, a systems administrator receiving a hundred thousand error reports may be overwhelmed by the sheer number of such reports and therefore in the aggregate those reports become more and more unhelpful and irrelevant.

SUMMARY OF THE INVENTION

Methods, systems, and computer program products for flexible event data content management for relevant event and alert analysis within a distributed processing system are provided. Embodiments include capturing, by an interface connector, an event from a resource of the distributed processing system; inserting, by the interface connector, the event into an event database; receiving from the interface connector, by a notifier, a notification of insertion of the event into the event database; based on the received notification, tracking, by the notifier, the number of events indicated as inserted into the event database; receiving from the notifier, by a monitor, a cumulative notification indicating the number of events that have been inserted into the event database; in response to receiving the cumulative notification, retrieving, by the monitor, from the event database, events inserted into the event database; and processing, by the monitor, the retrieved events.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
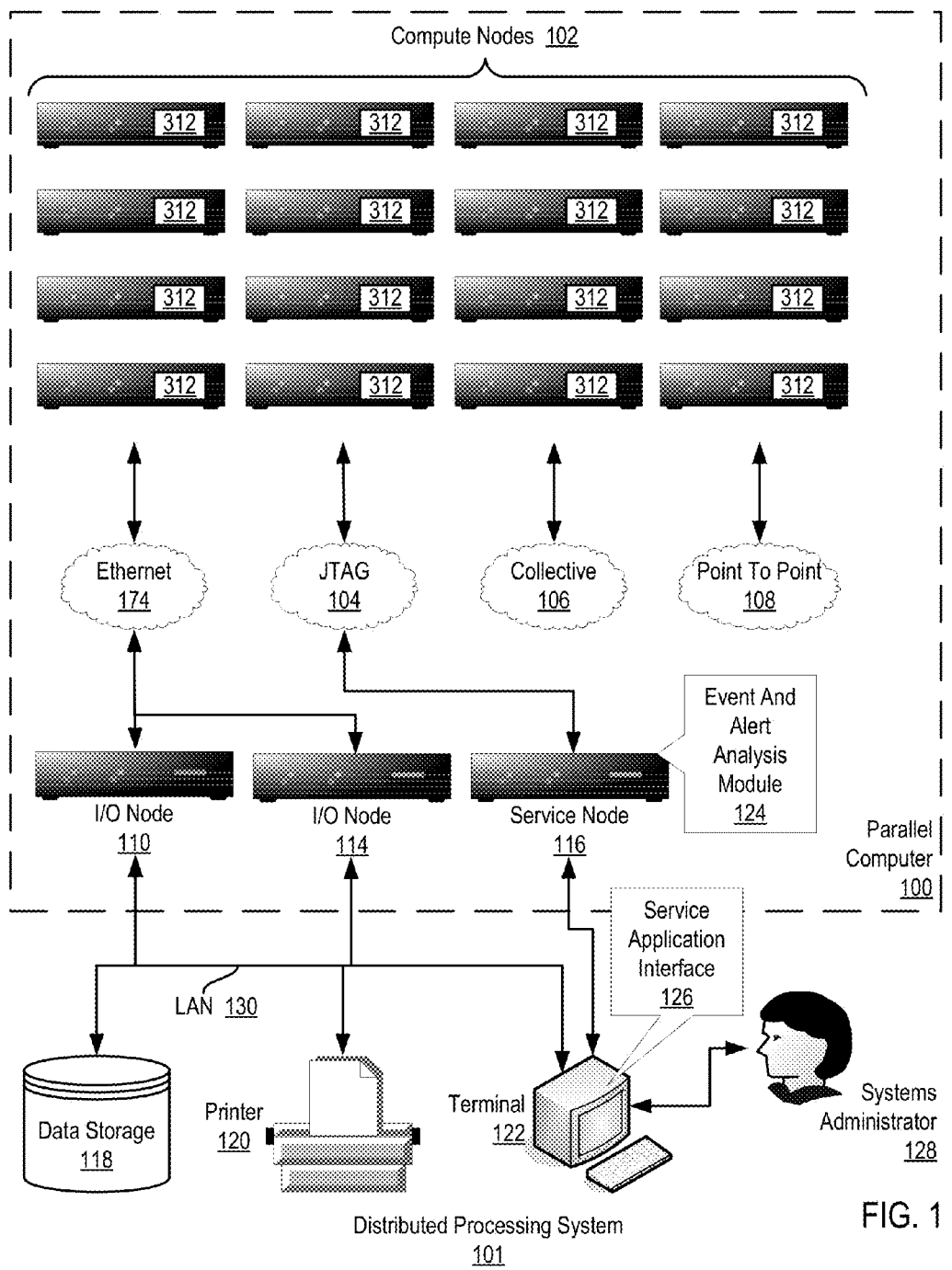
FIG. 1 illustrates an exemplary system for flexible event data content management for relevant event and alert analysis within a distributed processing system according to embodiments of the present invention.

Exemplary methods, systems, and computer program products for flexible event data content management for relevant event and alert analysis within a distributed processing system and according to embodiments of the present invention are described with reference to the accompanying drawings, beginning with FIG. 1. FIG. 1 illustrates an exemplary system for flexible event data content management for relevant event and alert analysis within a distributed processing system according to embodiments of the present invention. A distributed processing system is typically implemented as multiple autonomous or semi-autonomous computers that communicate through a computer network. In such example distributed processing systems, the computers often interact with each other in order to achieve a common goal. A computer program that runs in such an example distributed system is typically called a distributed program, and distributed programming is often used to describe the process of writing such programs.

In the example of FIG. 1, the distributed processing system (101) is implemented as a parallel computer (100), non-volatile memory for the computer in the form of data storage device (118), an output device for the computer in the form of printer (120), and an input/output device for the computer in the form of computer terminal (122). The parallel computer (100) in the example of FIG. 1 also includes a plurality of compute nodes (102). Each compute node is an automated computing device composed of one or more computer processors, its own computer memory, and its own input/output functionality. The compute nodes (102) are coupled for data communications by several independent data communications networks including a high speed Ethernet network (174), a Joint Test Action Group ('JTAG') network (104), a tree network (106) which is optimized for collective operations, and a torus network (108) which is optimized for point to point operations. Tree network (106) is a data communications network that includes data communications links connected to the compute nodes so as to organize the compute nodes as a tree. Each data communications network is implemented with data communications links among the compute nodes (102). The data communications links provide data communications for parallel operations among the compute nodes of the parallel computer.

In addition to compute nodes, computer (100) includes input/output ('I/O') nodes (110, 114) coupled to compute nodes (102) through one of the data communications networks (174). The I/O nodes (110, 114) provide I/O services between compute nodes (102) and I/O devices (118, 120, 122). I/O nodes (110, 114) are connected for data communications through local area network ('LAN') (130). Computer (100) also includes a service node (116) coupled to the compute nodes through one of the networks (104). Service node (116) provides service common to pluralities of compute nodes, loading programs into the compute nodes, starting program execution on the compute nodes, retrieving results of program operations on the computer nodes, and so on. Service node (116) runs an event and alert analysis module (124) and communicates with users (128) through a service application interface (126) that runs on computer terminal (122).

Many of the components of the distributed processing system of FIG. 1, that is the devices of the distributed processing system or processes running on the devices of the distributed processing system of FIG. 1 are capable of some form of error or status reporting through events and many of such components are also capable of receiving alerts in response to one or more of such events. Often in distributed processing systems useful according to embodiments of the present invention hundreds of thousands or millions of components may provide incidents, often in the form of events or receive alerts.

An incident is a generic term used in this specification to mean an identification or notification of a particular occurrence on a component of a distributed processing system such as events described below, a refined identification of an occurrence often based on events such as an alert described below, or other notifications as will occur to those of skill in the art.

Incidents are administered in pools for event and alert analysis according to embodiments of the present invention. A pool of incidents is a collection of incidents organized by the time of either their occurrence, by the time they are logged in an incident queue, included in the pool, or other time as will occur to those of skill in the art.

The service node (116) of FIG. 1 has installed upon it an event and alert analysis module (124) that includes at least two incident analyzers implemented as events analyzers and alerts analyzers capable of restarting event and alert analysis in a distributed processing system (101) according to embodiments of the present invention. The event and alert analysis module (124) includes computer program instructions configured to capture an event from a resource of the distributed processing system and insert the event into an event database; receive from the interface connector a notification of insertion of the event into the event database; based on the received notification, track the number of events indicated as inserted into the event database; receive from the notifier a cumulative notification indicating the number of events that have been inserted into the event database; in response to receiving the cumulative notification, retrieve from the event database, events inserted into the event database; and process the retrieved events.

The event and alert module (124) of FIG. 1 allows the number of incidents occurring such as events received and alerts produced at any given time to be less overwhelming to a systems administrator (128) attempting to identify a problem or occurrence in the distributed processing system. Administering event pools for relevant event analysis according to embodiments of the present invention provide alerts that are more meaningful to a user in determining how to administer the functions and errors associated with a distributed processing system.

The arrangement of nodes, networks, and I/O devices making up the exemplary distributed processing system illustrated in FIG. 1 are for explanation only, not for limitation of the present invention. Distributed data processing systems capable of administering event pools for relevant event analysis according to embodiments of the present invention may include additional nodes, networks, devices, and architectures, not shown in FIG. 1, as will occur to those of skill in the art. The parallel computer (100) in the example of FIG. 1 includes sixteen compute nodes (102); parallel computers capable of relevant alert delivery according to embodiments of the present invention sometimes include thousands of compute nodes. In addition to Ethernet and JTAG, networks in such data processing systems may support many data communications protocols including for example TCP (Transmission Control Protocol), IP (Internet Protocol), and others as will occur to those of skill in the art. Various embodiments of the present invention may be implemented on a variety of hardware platforms in addition to those illustrated in FIG. 1.

Figure 2:
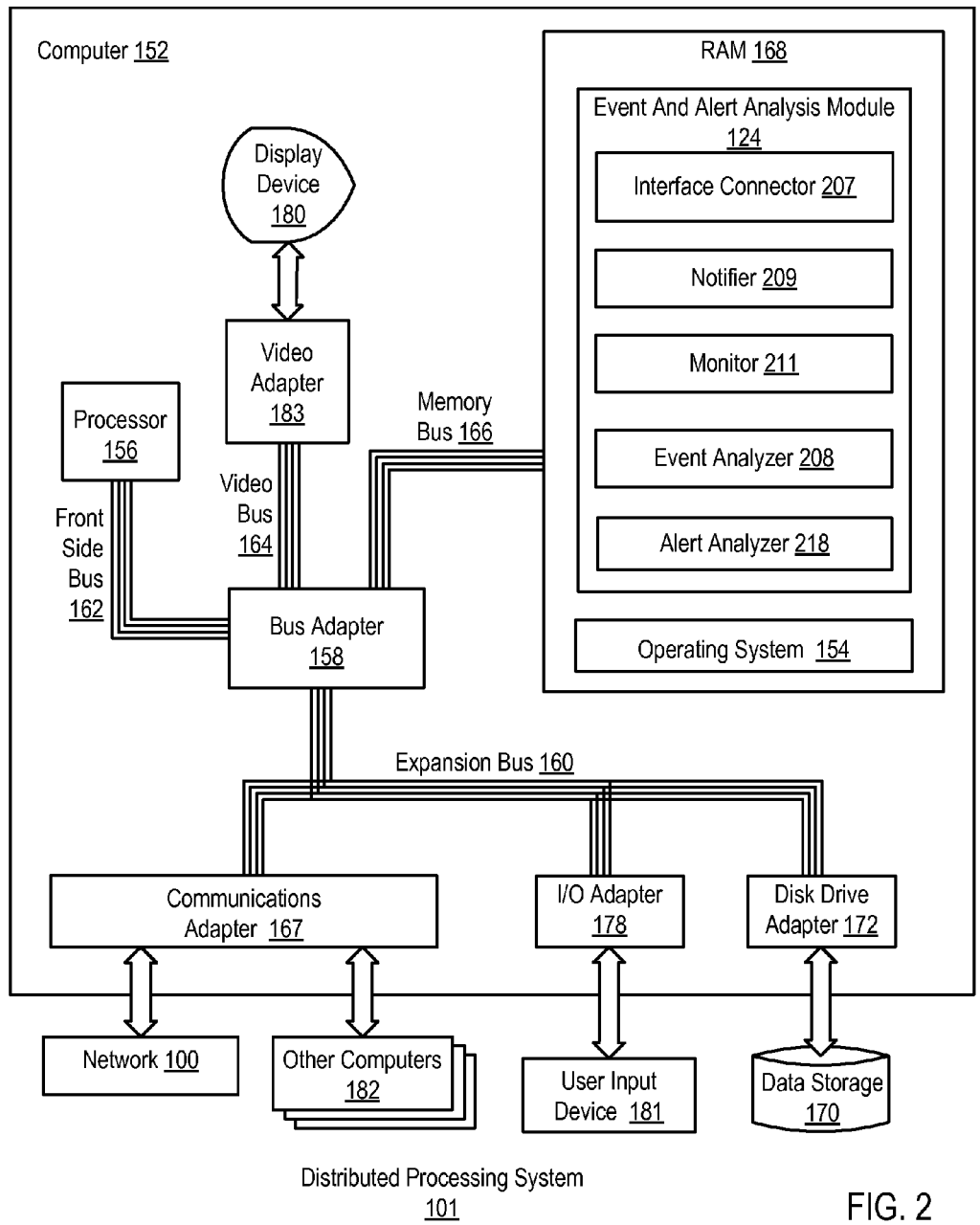
FIG. 2 sets forth a block diagram of automated computing machinery comprising an exemplary computer useful in administering event pools for relevant event analysis according to embodiments of the present invention.

Administering event pools for relevant event analysis in accordance with the present invention is generally implemented with computers, that is, with automated computing machinery. In the system of FIG. 1, for example, all the service nodes, I/O nodes, compute nodes, of the parallel computer are implemented to some extent at least as computers. For further explanation, therefore, FIG. 2 sets forth a block diagram of automated computing machinery comprising an exemplary computer (152) useful in relevant alert delivery according to embodiments of the present invention. The computer (152) of FIG. 2 includes at least one computer processor (156) or 'CPU' as well as random access memory (168) ('RAM') which is connected through a high speed memory bus (166) and bus adapter (158) to processor (156) and to other components of the computer (152) and through an expansion bus to adapters for communications with other components of a distributed processing system (101). Stored in RAM (168) is an event and alert analysis module (124), a module of automated computing machinery for relevant alert delivery according to embodiments of the present invention. The event and alert analysis module (124) includes two incident analyzers according to embodiments of the present invention. The incident analyzers include an event analyzer (208) and an alert analyzer (218). The event analyzer of FIG. 2 is a module of automated computing machinery capable of identifying alerts in dependence upon received events. That is, event analyzers typically receive events and produce alerts.

In many embodiments, a plurality of event analyzers are implemented in parallel. Often such event analyzers are assigned to a particular pool of events and may be focused on events from a particular component or caused by a particular occurrence to produce a more concise set of alerts.

The alert analyzer of FIG. 2 is a module of automated computing machinery capable of identifying alerts for transmission from events and other alerts, identifying additional alerts for transmission, and suppressing unnecessary, irrelevant, or otherwise unwanted alerts identified by the event analyzer. That is, alert analyzers typically receive alerts and events and produce or forward alerts in dependence upon those alerts and events. In many embodiments, a plurality of alert analyzers are implemented in parallel. Often such alert analyzers are assigned to a particular pool of alerts and may be focused on alerts with particular attributes to produce a more concise set of alerts.

The event analyzer (208) and the alert analyzer are each capable of flexible event data content management for relevant event and alert analysis within a distributed processing system according to embodiments of the present invention. The event analyzer administers pools of events according to embodiments of the present invention by assigning, by an events analyzer, a plurality of events to an events pool; determining, by an events analyzer in dependence upon the event analysis rules, to temporarily suppress events having particular attributes; determining, by an events analyzer, a duration for the suppression of the events; and suppressing, by an events analyzer, each event assigned to the pool having the particular attributes for the determined duration.

The event and alert analysis module (124) also includes an interface connector (207) that is configured to capture an event from a resource of the distributed processing system and insert the event into an event database. The event and alert analysis module (124) also includes a notifier (209) that is configured to receive from the interface connector a notification of insertion of the event into the event database and based on the received notification, track the number of events indicated as inserted into the event database. The event and alert analysis module (124) includes a monitor (211) that is configured to: receive from the notifier a cumulative notification indicating the number of events that have been inserted into the event database; in response to receiving the cumulative notification, retrieve from the event database, events inserted into the event database; and process the retrieved events.

Also stored in RAM (168) is an operating system (154). Operating systems useful for relevant alert delivery according to embodiments of the present invention include UNIX™, Linux™, Microsoft XP™, AIX™, IBM's i5/OS™ and others as will occur to those of skill in the art. The operating system (154), event and alert analysis module (124), the event analyzer (208), the alert analyzer (218) in the example of FIG. 2 are shown in RAM (168), but many components of such software typically are stored in non-volatile memory also, such as, for example, on a disk drive (170).

The computer (152) of FIG. 2 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers for relevant alert delivery according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 2 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 2 includes a video adapter (183), which is an example of an I/O adapter specially designed for graphic output to a display device (180) such as a display screen or computer monitor. Video adapter (183) is connected to processor (156) through a high speed video bus (164), bus adapter (158), and the front side bus (162), which is also a high speed bus.

The exemplary computer (152) of FIG. 2 includes a communications adapter (167) for data communications with other computers (182) and for data communications with a data communications network (100). Such data communications may be carried out serially through RS-232 connections, through external buses such as a Universal Serial Bus ('USB'), through data communications data communications networks such as IP data communications networks, and in other ways as will occur to those of skill in the art. Communications adapters implement the hardware level of data communications through which one computer sends data communications to another computer, directly or through a data communications network. Examples of communications adapters useful for relevant alert delivery according to embodiments of the present invention include modems for wired dial-up communications, Ethernet (IEEE 802.3) adapters for wired data communications network communications, and 802.11 adapters for wireless data communications network communications.

Figure 3:
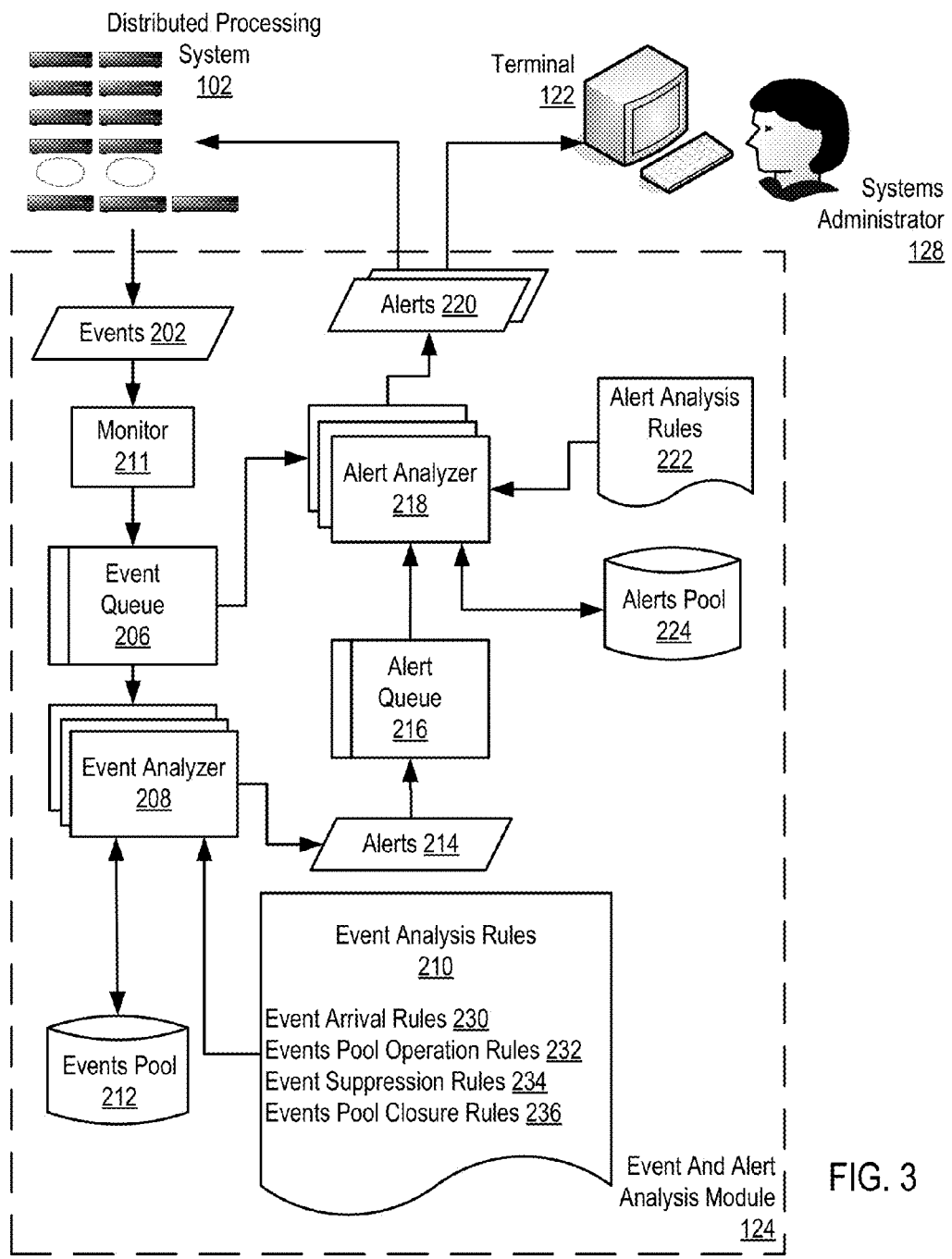
FIG. 3 sets forth a block diagram of an exemplary system for flexible event data content management for relevant event and alert analysis within a distributed processing system according to embodiments of the present invention.

For further explanation, FIG. 3 sets forth a block diagram of an exemplary system for flexible event data content management for relevant event and alert analysis within a distributed processing system (102) according to embodiments of the present invention. The system of FIG. 3 includes an event and alert analysis module (124). The event and alert analysis module (124) of FIG. 3 receives in an event queue (206) a plurality of events (202) from one or more components of a distributed processing system (102). A component of a distributed processing system according to embodiments of the present invention may be a device of the distributed processing system or a process running on a device of the distributed processing. Such components are often capable of some form event transmission, often for error or status reporting.

An event according to embodiments of the present invention is a notification of a particular occurrence in or on a component of the distributed processing system. Such events are sent from the component upon which the occurrence occurred or another reporting component to an event and alert analysis module according to the present invention. Often events are notifications of errors occurring in a component of the data processing system. Events are often implemented as messages either sent through a data communications network or shared memory. Typical events for event and alert analysis according to embodiments of the present invention an occurred time, a logged time, an event type, an event ID, a reporting component, and a source component, and other attributes. An occurred time is the time at which the event occurred on the component. A logged time is the time the event was included in the event queue (206) and is typically inserted into the event by the monitor (211) in the example of FIG. 3. An event type is a generic type of event such as for example, power error, link failure error, errors related to not receiving messages or dropping packets and so on as will occur to those of skill in the art. An event ID is a unique identification of the event. A reporting component is an identification of the component that reported the event. A source component is an identification of the component upon which the event occurred. In many cases, but not all, the reporting component and source component are the same component of the distributed processing system.

In the example of FIG. 3, the event and alert analysis module (124) includes a monitor (211) that receives events from components of the distributed processing system and puts the received events (202) in the event queue (206). The monitor (211) of FIG. 3 may receive events from components of the distributed processing system on their motion, may periodically poll one or more of the components of the distributed processing system, or receive events from components in other ways as will occur to those of skill in the art.

They system of FIG. 3 includes an event analyzer (208). The event analyzer (208) of FIG. 3 is a module of automated computing machinery capable of identifying alerts in dependence upon received events. That is, event analyzers typically receive events and produce alerts. In many embodiments, a plurality of event analyzers are implemented in parallel. Often event analyzers are assigned to a particular pool of events and may be focused on events from a particular component or caused by a particular occurrence to produce a more concise set of alerts.

The event analyzer (208) of FIG. 3 assigns each received event (202) to an events pool (212). An events pool (212) is a collection of events organized by the time of either their occurrence, by the time they are logged in the event queue, included in the events pool, or other time as will occur to those of skill in the art. That is, event pools are a collection of events organized by time. Such events pools often provide the ability to analyze a group of time related events identify alerts in dependence upon them. Often such event pools are useful in identifying fewer and more relevant alerts in dependence upon multiple related events.

The events pool (212) is administered by the event analyzer (208) according to embodiments of the present invention. The event analyzer administers pools of events according to embodiments of the present invention by receiving, by the event analyzer from the event queue, a plurality of events from one or more components of the distributed processing system; creating, by the event analyzer, a pool of events, the pool having a predetermined initial period of time; assigning, by the event analyzer, each received event to the pool; assigning, by the event analyzer, to each event a predetermined minimum time for inclusion in a pool; extending, by the event analyzer, for one or more of the events the predetermined initial period of time of the pool by a particular period of time assigned to the event; determining, by the event analyzer, whether conditions have been met to close the pool; and if conditions have been met to close the pool, determining for each event in the pool whether the event has been in the pool for its predetermined minimum time for inclusion in a pool; and if the event has been in the pool for us predetermined minimum time, including the event in the closed pool; and if the event has not been in the pool for its predetermined minimum time, evicting the event from the closed pool and including the event in a next pool.

As mentioned an events pool according to the method of FIG. 3 has a predetermined initial period of time and in the example of FIG. 3 assigning by the event analyzer each received event to an events pool includes extending for each event assigned to the events pool the predetermined initial period of time by a particular period of time assigned to the event. In this manner, the pool is extended with each received event until a collection of events that may be usefully used to identify alerts is assigned to the events pool.

As mentioned above, in some embodiments of the present invention, more than one event analyzer may operate in parallel. As such, each event analyzer may maintain one or more event pools for relevant alert delivery according to embodiments of the present invention. Assigning by the event analyzer the events to an events pool may therefore include selecting only events from one or more particular components. In such embodiments, particular components may be selected for a particular events pool to provide events associated with a particular period of time from a particular set of one or more components.

Assigning by the event analyzer the events to an events pool may also be carried out by selecting only events of a particular event type. In such embodiments, particular events may be selected for a particular events pool to provide events associated with a particular period of time from a particular set of event types.

Event analyzer (208) in the example of FIG. 3 identifies in dependence upon the event analysis rules (210) and the events assigned to the events pool one or more alerts (214). Event analyses rules (210) are a collection of predetermined rules for meaningfully parsing received events to identify relevant alerts in dependence upon the events.

The event analysis rules (210) of FIG. 3 include event arrival rules (230), events pool operation rules (232), event suppression rules (234), and events pool closure rules (236). Event arrival rules (230) are configurable predetermined rules for identifying alerts in dependence upon events in real time as those events are assigned to the events pool. That is, event arrival rules (230) identify alerts in dependence upon events before closing the events pool. Such rules are typically predetermined to identify particular alerts in dependence upon attributes of those events. Event arrival rules may for example dictate identifying a particular predetermined alert for transmission to a systems administrator in dependence upon a particular event type or component type for the event or other attribute of that event. Such rules are flexible and may be tailored to a particular distributed computing system and its functions.

An alert according to embodiments of the present invention is refined identification of an occurrence—such and an error—based upon more than one event and therefore provides an identification of the occurrence in the context of its operation in the distributed processing system. Often an alert may be a notification of a particular error type of occurrence that is identified in dependence upon the plurality of events received from one or more components of the data processing system, such as, for example, a link failure among a plurality of devices each of which are producing many events based upon the single link failure, or a power failure provoking thousands of events, and so on.

Alerts are often implemented as messages to be sent through a data communications network or shared memory. Typical alerts according to embodiments of the present invention have attributes attached to them based upon the attributes of the events received from which they are identified.

Events pool operation rules (232) are configurable predetermined rules for controlling the operations of the events pool. Such rules includes rules identifying the initial predetermined period of time for each events pool, rules dictating the length of time extended to the pool upon the assignment of each new event to the pool, rules dictating the minimum time an event must be in a pool before that event is included in a collection of events when the pool is closed, rules governing the closing of an events pool, and others as will occur to those of skill in the art. Such rules are flexible and may be tailored to a particular distributed computing system and its functions.

Event suppression rules (234) are configurable predetermined rules for suppressing one or more events in a closed pool of events used in identifying alerts. That is, often events in the closed events pool may be duplicate events, redundant events, or otherwise unnecessary or unhelpful events in identifying alerts. Such suppression rules are typically predetermined to delete, drop, or otherwise ignore those suppressed events. Event suppression rules may for example dictate that more than a threshold number of events of a particular event type or component type are to be suppressed. Such rules are also flexible and may be tailored to a particular distributed computing system and its functions.

Events pool closure rules (236) are configurable predetermined rules for identifying alerts in dependence upon unsuppressed events in the closed events pool and alerts identified by the event arrival rules. That is, events pool closure rules identify new alerts in dependence upon one or more or even all of the unsuppressed events in the closed events pool. The events pool closure rules also identify alerts in dependence upon the alerts identified by the event arrival rules (230) or a combination of the alerts identified by the event arrival rules (230) and one or more of the unsuppressed events in the closed events pool.

Event analyzer (208) in the example of FIG. 3 sends all the alerts (214) identified by the event analyzer (208) to an alert analyzer (218). The alert analyzer of FIG. 3 is a module of automated computing machinery capable of identifying alerts for transmission from events and other alerts, identifying additional alerts for transmission, and suppressing unnecessary, irrelevant, or otherwise unwanted or unhelpful alerts identified by the event analyzer. That is, alert analyzers typically receive alerts and events and produce or forward alerts in dependence upon those alerts and events. In many embodiments, a plurality of alert analyzers are implemented in parallel. The alerts (214) in the example of FIG. 3 are sent from event analyzer (208) to an alert analyzer (218) through an alerts queue (216).

The alert analyzer (218) of FIG. 3 assigns each of the identified alerts (214) to an alerts pool (224). An alerts pool (224) is a collection of alerts organized by the time of one or more the events causing the alert to be identified, the time the alert is identified, or other time as will occur to those of skill in the art. That is, alerts pools are a collection of alerts organized by time. Such alerts pools often provide the ability to analyze a groups alerts identified and included in the alerts pool according to some time. Often such alerts pools are useful in identifying fewer and more relevant alerts in dependence upon multiple related events and multiple related alerts.

The alert analyzer administers pools of alerts according to embodiments of the present invention by receiving, by an alert analyzer from an alert queue, a plurality of alerts from one or more components of the distributed processing system; creating, by the alert analyzer, a pool of alerts, the pool having a predetermined initial period of time; assigning, by the alert analyzer, each received alert to the pool; assigning, by the alert analyzer, to each alert a predetermined minimum time for inclusion in a pool; extending, by the alert analyzer, for one or more of the alerts the predetermined initial period of time of the pool by a particular period of time assigned to the alert; determining, by the alert analyzer, whether conditions have been met to close the pool; and if conditions have been met to close the pool, determining for each alert in the pool whether the alert has been in the pool for its predetermined minimum time for inclusion in a pool; and if the alert has been in the pool for us predetermined minimum time, including the alert in the closed pool; and if the alert has not been in the pool for its predetermined minimum time, evicting the alert from the closed pool and including the alert in a next pool.

The alert analyzer may assign the identified alerts to an alerts pool (224) in dependence upon attributes of the alerts or attributes of the events from which those alerts were identified. For example, the alert analyzer of FIG. 3 may assign alerts to the alerts pool (224) by selecting alerts generated from events from one or more particular components, alerts associated with a particular alert type and so on as will occur to those of skill in the art.

The alert analyzer (218) of FIG. 3 determines in dependence upon alert analysis rules (222) and the alerts in the alert pool whether to suppress any alerts. Suppressing an alert is typically carried out by dropping the alert, deleting the alert or otherwise ignoring or not transmitting the suppressed alert to a component of the distributed processing system.

Alert analyses rules (222) are a collection of rules for suppressing one or more alerts to provide a more relevant set of alerts for transmission to a component of the distributed processing system, such as for example, for display to a systems administrator and to identify additional alerts for transmission to one or more components of the distributed processing system. Alert analysis rules for example may dictate that duplicate alerts are to be suppressed, alerts of a particular type for transmission to a particular component are to be suppressed, alerts of a particular type be transmitted to a particular component are to be suppressed and so on as will occur to those of skill in the art. Such alerts may be more meaningful to a component of the distributed processing system for automated error recovery or for a systems administrator who may otherwise be less informed by a number of raw unanalyzed alerts.

The alert analyzer (218) of FIG. 3 also has access to the events queue (206). The alert analyzer (218) of FIG. 3 in dependence upon the alert analysis rules may, in some embodiments select events from the events queue and determine whether to suppress any alerts in dependence upon the selected events. That is, alert analysis rules may also take into account events and their attributes for suppressing alerts and for identifying additional alerts for transmission to one or more components. Such events may be related to the alerts in the alerts pool or independent from such alerts.

The alert analyzer (218) of FIG. 3 transmits the unsuppressed alerts to one or more components of the distributed processing system. The alert analyzer may transmit the unsuppressed alerts to one or more components of the distributed processing system by sending the alert as a message across a data communications network, through shared memory, or in other ways as will occur to those of skill in the art. In the example of FIG. 3, the unsuppressed alerts (220) are transmitted to a terminal (122) for display to a systems administrator (128).

The alert analyzer (218) of FIG. 3 is also capable of identifying in dependence upon alert analysis rules (222), the alerts in the alert pool (224), and selected events in the event queue (206) one or more additional alerts and transmitting the one or more components of the distributed processing system. The additional alerts may include one or more alerts not identified by the event analyzer. Such additional alerts may provide additional information to a component of the distributed processing system of a systems administrator.

As mentioned above, relevant alert delivery according to the present invention includes assigning events to an event pool and those pools are administered according to embodiments of the present invention. For further explanation, FIG. 4 sets forth a diagram illustrating assigning events to an event pool according to embodiments of the present invention. An events pool (212) is a collection of events organized by the time of either their occurrence, by the time they are logged in the event queue, included in the events pool, or other time as will occur to those of skill in the art. That is, event pools are a collection of events organized by time. Such events pools often provide the ability to analyze a group of time related events and to identify alerts in dependence upon them. Often such event pools are useful in identifying fewer and more relevant alerts in dependence upon multiple related events.

Events pools according to embodiments of the present invention are typically operated according to events pool operation rules which are themselves often included in event analysis rules. Such events pool operation rules are configurable predetermined rules for controlling the operations of the events pool. Such rules includes rules identifying the initial predetermined period of time for each events pool, rules dictating the length of time extended to the pool upon the assignment of each new event to the pool, rules dictating the minimum time an event must be in a pool before that event is included in a collection of events when the pool is closed, rules governing the closing of an events pool, and others as will occur to those of skill in the art. Such rules are flexible and may be tailored to a particular distributed computing system and its functions.

Figure 4:
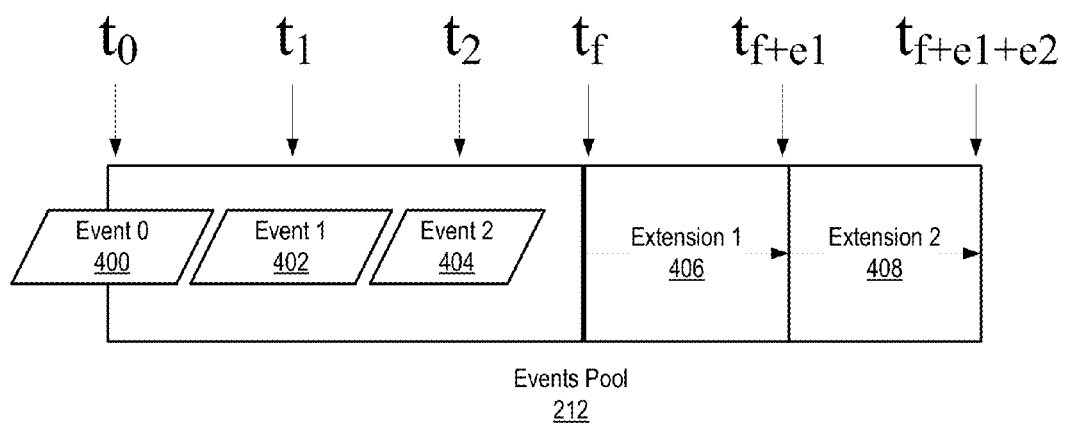
FIG. 4 sets forth a diagram illustrating assigning events to an event pool according to embodiments of the present invention.

Events are often assigned to an events pool according to their logged time. That is, events are typically inserted into the events pool in the order that they are received in the event queue. In the example of FIG. 4, the timing of the events pool (212) is initiated when the first event 'Event 0' (400) is assigned to the events pool (212) at time $t_0$. The events pool of FIG. 4 is initiated for a predetermined initial period of time from $t_1$ to $t_f$. That is, upon receiving the first event 'Event 0' (400) the events pool of FIG. 4 has a predetermined initial period of time beginning at $t_1$ and ending at $t_f$. The predetermined initial period of time may be configured in dependence upon a number of factors as will occur to those of skill in the art such as, the number of components in the distributed processing system, the frequency of receiving events, the types of events typically received and so on as will occur to those of skill in the art.

In the example FIG. 4, the initial period of time is extended for each new event assigned to the events pool during the predetermined initial period from $t_1$ to $t_f$ by a particular period of time assigned to the event. In the example of FIG. 4 upon assigning 'Event 1' (402) to the events pool (212) the predetermined initial period of time $t_0$–$t_f$ is extended by 'Extension 1' (406) having a time of e1 thereby creating a new time for closing the events pool (212) at $t_{f+e1}$ if no other events are assigned to the pool before $t_{f+e1}$. Similarly, in the example of FIG. 4 upon assigning 'Event 2' (404) to the events pool having a time of e2, the now extended period of time from $t_0$–$t_{f+e1}$ is extended again by extension 2 (408) thereby establishing a new time for closing the pool at time $t_{f+e1+e2}$ if no other events are assigned to the pool before $t_{f+e1+e2}$ or before some maximum time for the events pool has expired. In this manner, the event pool is extended with each received event until a collection of events that may be usefully used to identify alerts is assigned to the events pool.

In typical embodiments of the present invention, event pools may have a maximum duration that can no longer be extended. In such cases, a requirement may exist that an event that has not resided in the event pool for a threshold period of time be moved to a next events pool. In some embodiments, the attributes of such an event that is moved to the next events pool are used for relevant alert delivery according to embodiments of the present invention with the initial events pool and in other embodiments, the attributes of such an event are used for relevant alert delivery with the next events pool to which that event is moved.

In the example of FIG. 4, when conditions are met to close the pool an events analyzer determines for each event (400, 402, 404) in the pool (212) whether the event has been in the pool for its predetermined minimum time for inclusion in a pool. If the event has been in the pool for its predetermined minimum time, the event is included in the closed pool for event analysis for relevant alert delivery according to embodiments of the present invention. If the event has not been in the pool for its predetermined minimum time, the event is evicted from the closed pool and included a next pool for event analysis for relevant alert delivery according to embodiments of the present invention.

In many embodiments, a plurality of events pools may be used in parallel and one or more of such events pools are assigned to a particular events analyzer. In such embodiments, events analyzers may be directed to events in events pools having particular attributes.

Figure 5:
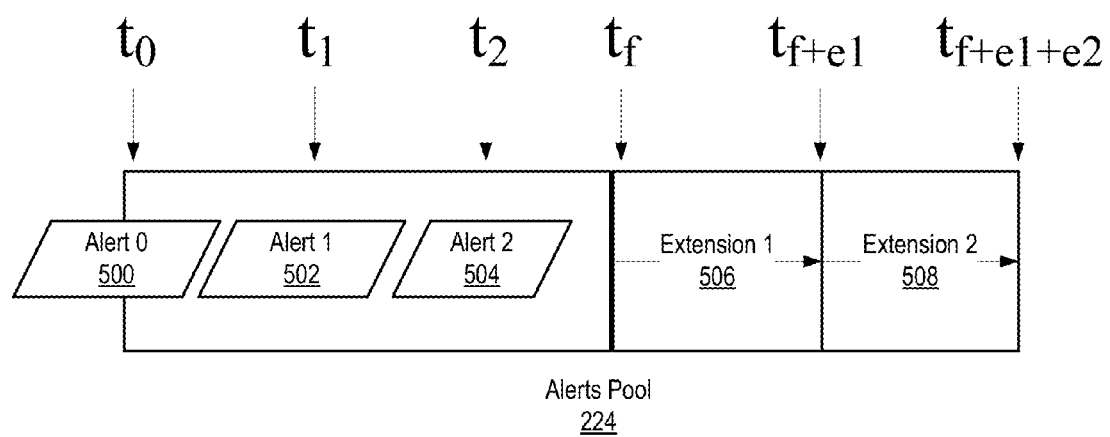
FIG. 5 sets forth a diagram illustrating assigning alerts to an alert pool according to embodiments of the present invention.

As mentioned above, relevant alert delivery according to the present invention also includes assigning alerts to an alerts pool. For further explanation, FIG. 5 sets forth a diagram illustrating assigning alerts to an alert pool according to embodiments of the present invention. The alerts pool (224) of FIG. 5 operates in a manner similar to the events pool of FIG. 4. That is, the alerts pool according to the example of FIG. 5 includes alerts and the timing of the alerts pool begins with the first alert 'Alert 0' (500) at time $t_0$ and is configured to have a predetermined initial period of time $t_0$–tf. In the example of FIG. 5, the initial period of time is extended for each new alert assigned to the alerts pool in the predetermined initial period from $t_1$ to $t_f$ by a particular period of time assigned to the alert. In the example of FIG. 5, upon assigning 'Alert 1' (502) to the alerts pool (224) the predetermined initial period of time $t_0$–$t_f$ is extended by 'Extension 1' (506) having a time of e1 thereby creating a new time for closing the alerts pool (224) at $t_{f+e1}$ if no other alerts are assigned to the pool before $t_{f+e1}$. Similarly, in the example of FIG. 4 upon assigning 'Alert 2' (504) to the alerts pool having a time of e2, the now extended period of time from $t_0$–$t_{f+e1}$ is extended again by 'Extension 2' (508) thereby establishing a new time for closing the pool at time $t_{f+e1+e2}$ if no other alerts are assigned to the pool before $t_{f+e1+e2}$ or before some maximum time for the alerts pool has expired.

In typical embodiments of the present invention, alerts pools may have a maximum duration that can no longer be extended. In such cases, a requirement may exist that an alert that has not resided in the alert pool for a threshold period of time be moved to a next alerts pool. In some embodiments, the attributes of such an alert that is moved to the next alerts pool are used for relevant alert delivery according to embodiments of the present invention with the initial alerts pool and in other embodiments, the attributes of such an alert are used for relevant alert delivery with the next alerts pool to which that alert is moved.

In the example of FIG. 5, when conditions are met to close the pool an alerts analyzer determines for each alert (500, 502, 504) in the pool (224) whether the alert has been in the pool for its predetermined minimum time for inclusion in a pool. If the alert has been in the pool for its predetermined minimum time, the alert is included in the closed pool for alert analysis for relevant alert delivery according to embodiments of the present invention. If the alert has not been in the pool for its predetermined minimum time, the alert is evicted from the closed pool and included a next pool for alert analysis for relevant alert delivery according to embodiments of the present invention.

In many embodiments, a plurality of alerts pools may be used in parallel and one or more of such alerts pools are assigned to a particular alerts analyzer. In such embodiments, alerts analyzers may be directed to alerts in alerts pools having particular attributes.

Figure 6:
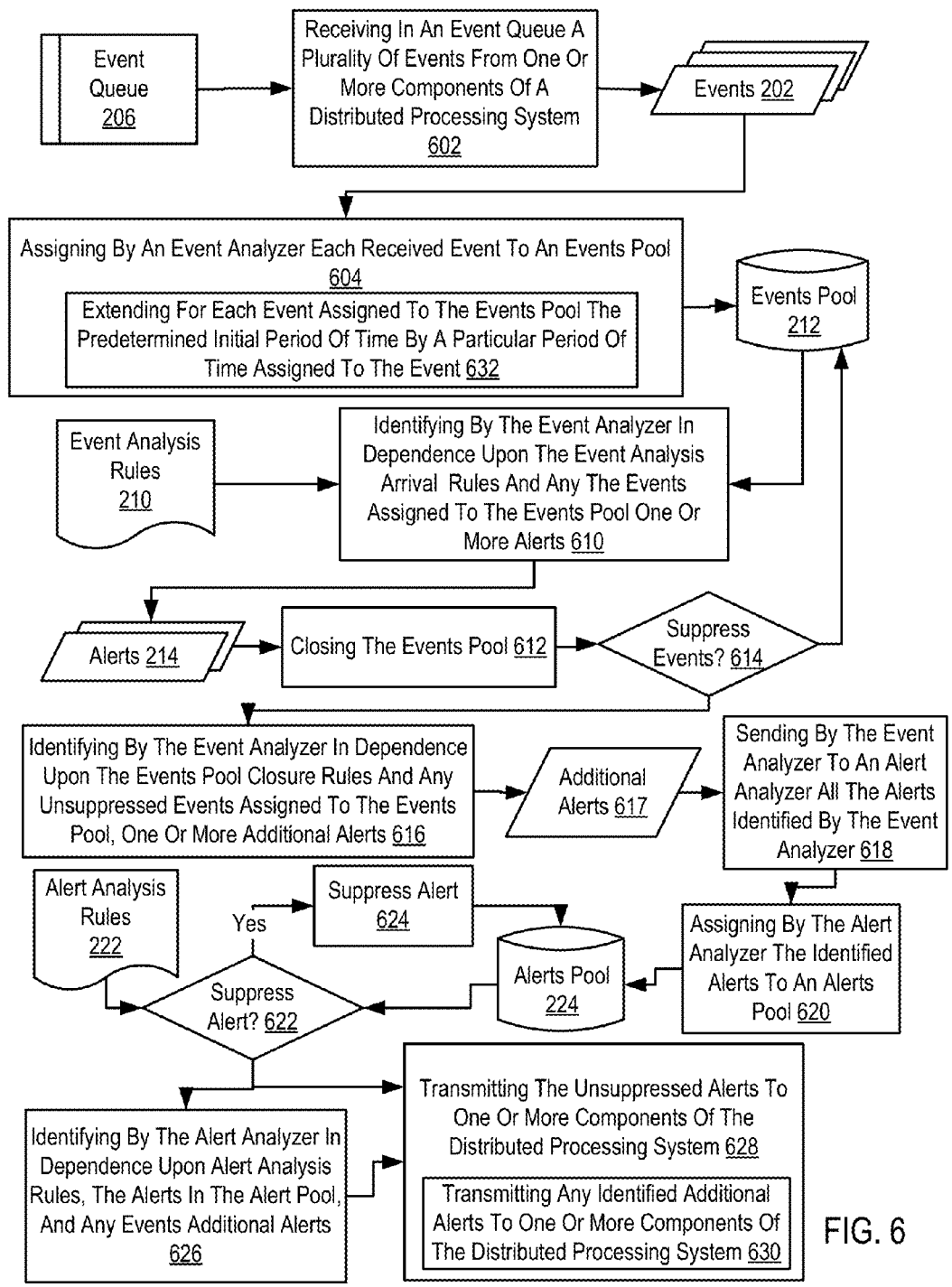
FIG. 6 sets forth a flow chart illustrating an example method of administering event pools for relevant event analysis according to embodiments of the present invention.

For further explanation, FIG. 6 sets forth a flow chart illustrating an example method of administering event pools for relevant alert analysis in a distributed processing system according to embodiments of the present invention. The method of FIG. 6 includes receiving (602) in an event queue a plurality of events (202) from one or more components of a distributed processing system. Events useful in relevant alert delivery with event and alert suppression according to embodiments of the present invention may include an occurred time, a logged time, an event type, an event ID, a reporting component, and a source component.

Receiving (602) in an event queue a plurality of events (202) from one or more components of a distributed processing system may be carried out by receiving an event initiated by one or more components of the data processing system and storing the event in the event queue according to the time in which the event occurred or according to the time the event was received. Receiving (602) in an event queue a plurality of events (202) from one or more components of a distributed processing system also may be carried out by polling a component for status and receiving in response an event and storing the event in the event queue according to the time in which the event occurred or according to the time the event was received.

The method of FIG. 6 also includes assigning (604) by an event analyzer each received event to an events pool (212). In some embodiments of the present invention, assigning (604) by an event analyzer each received event (202) to an events pool (212) may be carried out by assigning events to the event pool according to the logged time. Assigning (604) by an event analyzer each received event (202) to an events pool (212) may also be carried out in dependence upon attributes of the event. Such attributes may include an identification or type of the component upon which an occurrence occurred to create the event, the reporting component of the event, the event ID, the event type, and so on as will occur to those of skill in the art.

An events pool according to the method of FIG. 6 includes events occurring during a predetermined initial period of time and in the example of FIG. 6 assigning (604) by the event analyzer each received event to an events pool includes extending (632) for each event assigned to the events pool the predetermined initial period of time by a particular period of time assigned to the event.

The event analyzer includes event analysis rules (210) including, event arrival rules, events pool operation rules, event suppression rules, and events pool closure rules.

Event arrival rules are configurable predetermined rules for identifying alerts in dependence upon events in real time as those events are assigned to the events pool. That is, event arrival rules identify alerts in dependence upon events before closing the events pool. Such rules are flexible and may be tailored to a particular distributed computing system and its functions.

An alert according to embodiments of the present invention is refined identification of an occurrence—such and an error—based upon more than one event and therefore provides an identification of the occurrence in the context of its operation in the distributed processing system. Often an alert may be a notification of a particular error type of occurrence that is identified in dependence upon the plurality of events received from one or more components of the data processing system, such as, for example, a link failure among a plurality of devices each of which are producing many events based upon the single link failure, or a power failure provoking thousands of events, and so on.

Alerts are often implemented as messages to be sent through a data communications network or shared memory. Typical alerts according to embodiments of the present invention have attributes attached to them based upon the attributes of the events received from which they are identified.

Events pool operation rules are configurable predetermined rules for controlling the operations of the events pool. Such rules includes rules identifying the initial predetermined period of time for each events pool, rules dictating the length of time extended to the pool upon the assignment of each new event to the pool, rules dictating the minimum time an event must be in a pool before that event is included in a collection of events when the pool is closed, rules governing the closing of an events pool, and others as will occur to those of skill in the art. Such rules are flexible and may be tailored to a particular distributed computing system and its functions.

Event suppression rules are configurable predetermined rules for suppressing one or more events in a closed pool of events used in identifying alerts. That is, often events in the closed events pool may be duplicate events, redundant events, or otherwise unnecessary or unhelpful events in identifying alerts. Such suppression rules are typically predetermined to delete, drop, or otherwise ignore those suppressed events. Event suppression rules may for example dictate that more than a threshold number of events of a particular event type or component type are to be suppressed. Such rules are also flexible and may be tailored to a particular distributed computing system and its functions.

Events pool closure rules are configurable predetermined rules for identifying alerts in dependence upon unsuppressed events in the closed events pool and alerts identified by the event arrival rules. That is, events pool closure rules identify new alerts in dependence upon one or more or even all of the unsuppressed events in the closed events pool. The events pool closure rules also identify alerts in dependence upon the alerts identified by the event arrival rules or a combination of the alerts identified by the event arrival rules and one or more of the unsuppressed events in the closed events pool.

The method of FIG. 6 also includes identifying (610) by the event analyzer in dependence upon the event arrival rules and the events assigned to the events pool one or more alerts (214). Identifying (610) by the event analyzer in dependence upon the event arrival rules and the events assigned to the events pool one or more alerts (214) may be carried out by identifying alerts in dependence upon one or more attributes of the events as that event is assigned to the events pool. Identifying (610) by the event analyzer in dependence upon the event arrival rules and the events assigned to the events pool one or more alerts (214) may be carried by comparing the attributes of the events to the event arrival rules and identifying as a result of the comparison one or more alerts. Such attributes may include the type of component from which the event was received, the type of component creating the event, the identification of the component creating the event, the time the event was created or received, an error reported in the event, and many others as will occur to those of skill in the art.

The method of FIG. 6 also includes closing (612), by the event analyzer in dependence upon the events pool operation rules, the events pool (212). Closing (612), by the event analyzer in dependence upon the events pool operation rules, the events pool (212) may be carried out by determining that conditions dictated by the events pool operation rules have been met to stop assigning new events to the events pool and identifying in dependence upon those events pool operation rules the particular events that are included in the closed pool of events.

Closing the events pool may be carried out by determining that the initial period of time for the events pool and any particular periods of time for events received in the events pool extended to the initial period of time have expired. In such cases, if no new events are received prior to the expiration of the initial period of time for the events pool and any particular periods of time for events received in the events pool extended to the initial period of time the pool is closed.

Closing the events pool may also be carried out by determining that a maximum duration for the events pool has expired. In such cases, regardless of the number of new events being received after a maximum duration for the events pool has expired the pool is closed. In such embodiments, a maximum duration for the events pool prevents the events pool from including more events than are useful for relevant alert delivery according to embodiments of the present invention.

The method of FIG. 6 also includes determining (614), by the events analyzer in dependence upon the event suppression rules, whether to suppress one or more events in the closed events pool (212). Determining (614), by the events analyzer in dependence upon the event suppression rules, whether to suppress one or more events in the closed events pool (212) may be carried out by determining in dependence upon the attributes of one or more events in the closed pool whether to delete, drop, or otherwise ignore one or more of the events in the closed pool.

The method of FIG. 6 includes identifying (616) by the event analyzer in dependence upon the events pool closure rules and any unsuppressed events assigned to the events pool, one or more additional alerts (617). Identifying (616) by the event analyzer in dependence upon the events pool closure rules and any unsuppressed events assigned to the events pool, one or more additional alerts (617) may be carried out by identifying alerts in dependence upon one or more attributes of the events as that event is assigned to the events pool. Identifying (616) by the event analyzer in dependence upon the events pool closure rules and any unsuppressed events assigned to the events pool, one or more additional alerts (617) may be carried out by selecting the unsuppressed events for the events pool, comparing the attributes of the unsuppressed events of the events pool to the pool closure rules, and identifying as a result of the comparison one or more additional alerts. Such attributes may include the type of component from which one or more of the unsuppressed events are received, the type of components creating the unsuppressed events, the identification of the component creating the unsuppressed events, the time the events were created or received, one or more errors reported by the events event, the number of events in the pool, and many others as will occur to those of skill in the art.

The method of FIG. 6 includes sending (618) by the event analyzer to an alert analyzer all the alerts identified by the event analyzer. Sending (618) by the event analyzer to an alert analyzer all the alerts (214) identified by the event analyzer may be carried out by sending a message containing the alerts from the event analyzer to the alert analyzer. Such a message may be sent from the event analyzer to the alert analyzer across a network, through shared memory, or in other ways as will occur to those of skill in the art.

The method of FIG. 6 includes assigning (620) by the alert analyzer the identified alerts to an alerts pool (224). An alerts pool according to the method of FIG. 6 has a predetermined initial period of time and in the example of FIG. 6 assigning (620) by the alert analyzer the identified alerts to an alerts pool (224) includes extending for each alert assigned to the alerts pool the predetermined initial period of time by a particular period of time assigned to the alert. Assigning (620) by the alert analyzer the identified alerts to an alerts pool (224) also may be carried out in dependence upon attributes of the alerts. Such attributes may include an identification or type of the component upon which an occurrence occurred to create the event that was used to identify the alert, the alert ID, the alert type, and so on as will occur to those of skill in the art.

The method of FIG. 6 includes determining (622) by the alert analyzer in dependence upon alert analysis rules (222) and the alerts in the alert pool whether to suppress any alerts. Determining (622) by the alert analyzer in dependence upon alert analysis rules (222) and the alerts in the alert pool whether to suppress (624) any alerts may be carried out in dependence upon one or more attributes of the alerts. Such attributes may include an identification or type of the component upon which an occurrence occurred to create the event that was used to identify the alert, the alert ID, the alert type, and so on as will occur to those of skill in the art. In such embodiments, determining (622) by the alert analyzer in dependence upon alert analysis rules (222) and the alerts in the alert pool whether to suppress any alerts may be carried out by comparing the attributes of the alerts in the alerts pool to the alert analysis rules and identifying as a result of the comparison one or more alerts for suppression according to the event analysis rules.

The method of FIG. 6 includes transmitting (628) the unsuppressed alerts to one or more components of the distributed processing system. Transmitting (628) the unsuppressed alerts to one or more components of the distributed processing system may be carried out by sending a message containing the alert to one or more components of the distributed processing system. In many cases, an alert may be sent as a message to a systems administrator advising the systems administrator of one or more occurrences within the distributed processing system.

As mentioned above, alert analysis rules may select additional alerts or suppress alerts in dependence upon events. In such embodiments, determining whether to suppress any alerts includes selecting events and determining whether to suppress any alerts in dependence upon the selected events. The method of FIG. 6 therefore also includes identifying (626) by the alert analyzer in dependence upon alert analysis rules (222), the alerts in the alert pool (224), and any selected events one or more additional alerts and in the method of FIG. 6, transmitting (628) the unsuppressed alerts also includes transmitting (630) any additional alerts to one or more components of the distributed processing system.

As mentioned above, relevant alert delivery according to embodiments of the present invention includes the administration of one or more pools of incidents such as events, alerts or other incidents as will occur to those of skill in the art. For further explanation, FIG. 7 sets forth a flow chart illustrating an exemplary method of flexible event data content management for relevant event and alert analysis within a distributed processing system according to embodiments of the present invention. The method of FIG. 7 includes capturing (702), by an interface connector (207), an event (202) from a resource (750) of the distributed processing system. Capturing (702) an event (202) from a resource (750) of the distributed processing system may be carried out by receiving events from components of the distributed processing system on their motion, periodically polling one or more of the resources of the distributed processing system, or receiving events from resources in other ways as will occur to those of skill in the art. A resource of the distributed processing system may include both software and hardware components.

Figure 7:
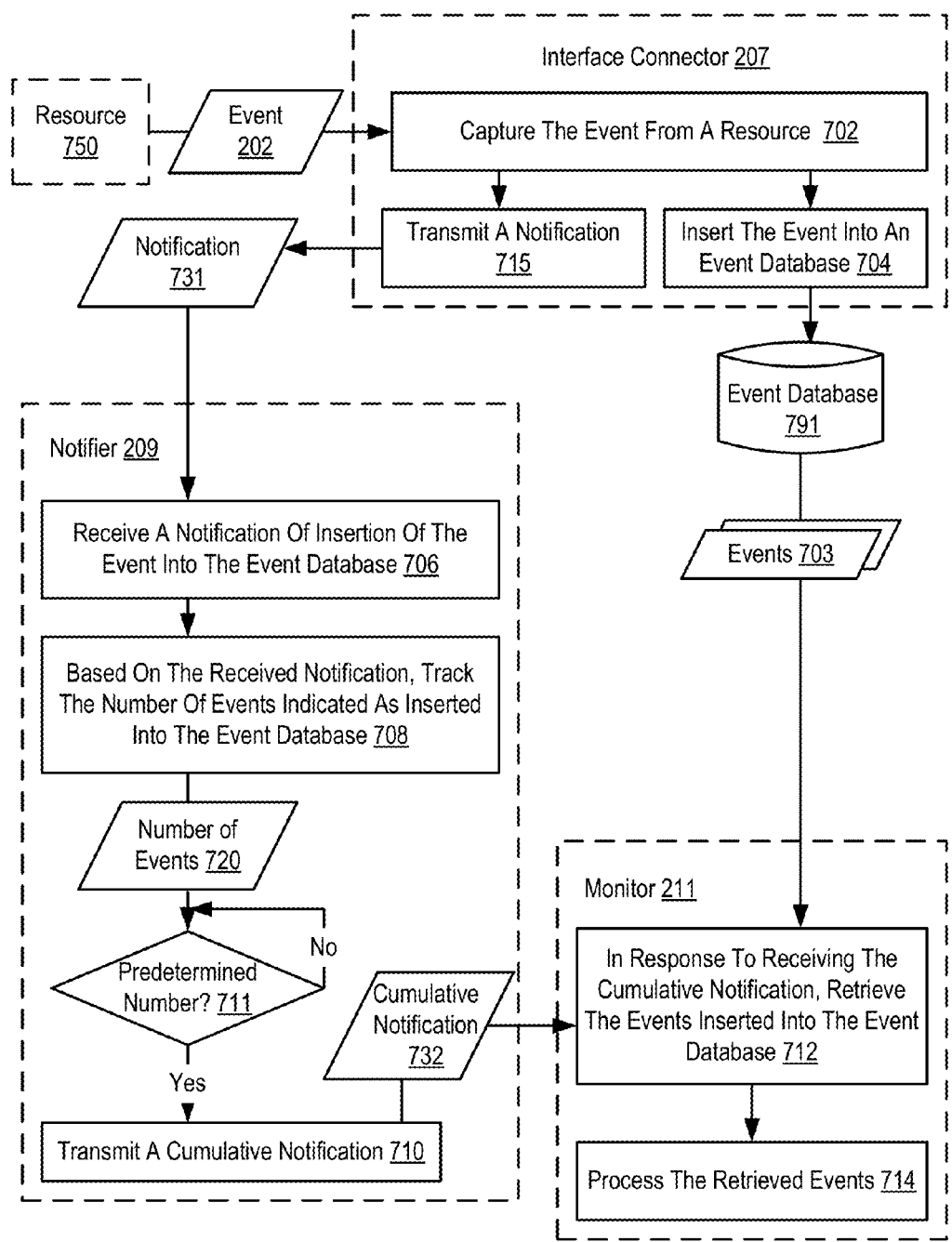
FIG. 7 sets forth a flow chart illustrating an exemplary method of flexible event data content management for relevant event and alert analysis within a distributed processing system according to embodiments of the present invention.

The method of FIG. 7 also includes inserting (704), by the interface connector (207), the event (202) into an event database (791). Inserting (704) the event (202) into an event database (791) may be carried out by storing the event (202) in the event database (791) and updating information within the event database (791) to reflect the insertion.

The method of FIG. 7 includes transmitting (715), by the interface connector (207), a notification (731) indicating insertion of the event (202) into the event database (791). Transmitting (715) a notification (731) indicating insertion of the event (202) into the event database (791) may be carried out by creating an identifier for the event (202) and using the identifier in the notification (731).

The method of FIG. 7 includes receiving (706) from the interface connector (207), by a notifier (209), the notification (731) of insertion of the event (202) into the event database (791). Receiving (706) from the interface connector (207) the notification (731) of insertion of the event (202) into the event database (791) may be carried out by retrieving an identifier corresponding to the event (202); and using the identifier to track the event (202) within the notifier.

The method of FIG. 7 includes based on the received notification (731), tracking (708), by the notifier (209), the number (720) of events indicated as inserted into the event database (791). Tracking (708) the number (720) of events indicated as inserted into the event database (791) may be carried out by incrementing a variable stored within an event and alert analysis module (124). The variable may be a semaphore that is accessible to many different processes within the distributed processing system.

The method of FIG. 7 includes transmitting (710), by the notifier, a cumulative notification (732) indicating the number (720) of events that have been inserted into the event database (791). That is, the cumulative notification indicates one or more events that are ready for the monitor to process. Transmitting (710) a cumulative notification (732) indicating the number (720) of events that have been inserted into the event database (791) may be carried out by creating a message that identifies the events that are ready for processing and transmitting that message to the monitor (211). In the method of FIG. 7, transmitting the cumulative notification is based on a determination of the number of events (720) that the notifier has been notified of insertion. However, the notifier may be configured to transmit the cumulative notification based on a variety of conditions, variables, and other factors as will occur to those of skill in the art. The cumulative notification may transmitted by the notifier in response to the notifier determining that a predetermined amount of time has elapsed.

The method of FIG. 7 includes determining (711), by the notifier, whether the number (720) of events that the interface connector (207) has indicated have been inserted into the event database (791) exceeds a predetermined number. Determining (711) whether the number (720) of events that the interface connector (207) has indicated have been inserted into the event database (791) exceeds a predetermined number may be carried out by comparing the predetermined number to the tracked number (720) of events that are ready for processing.

The method of FIG. 7 also includes in response to receiving the cumulative notification (732), retrieving (712), by the monitor (211), from the event database (791), events (703) inserted into the event database (791). Retrieving (712) from the event database (791), events (703) inserted into the event database (791) may be carried out by querying the event database (791) with an identifier of the one or more events identified in the cumulative notification (732); and receiving the one or more events from the event database (791) in response to the query.

The method of FIG. 7 includes processing (714), by the monitor (211), the retrieved events (703). Processing (714) the retrieved events (703) may be carried out by transmitting the retrieved events (703) to other components of the event and analysis module (124), such as an event analyzer.

Figure 8:
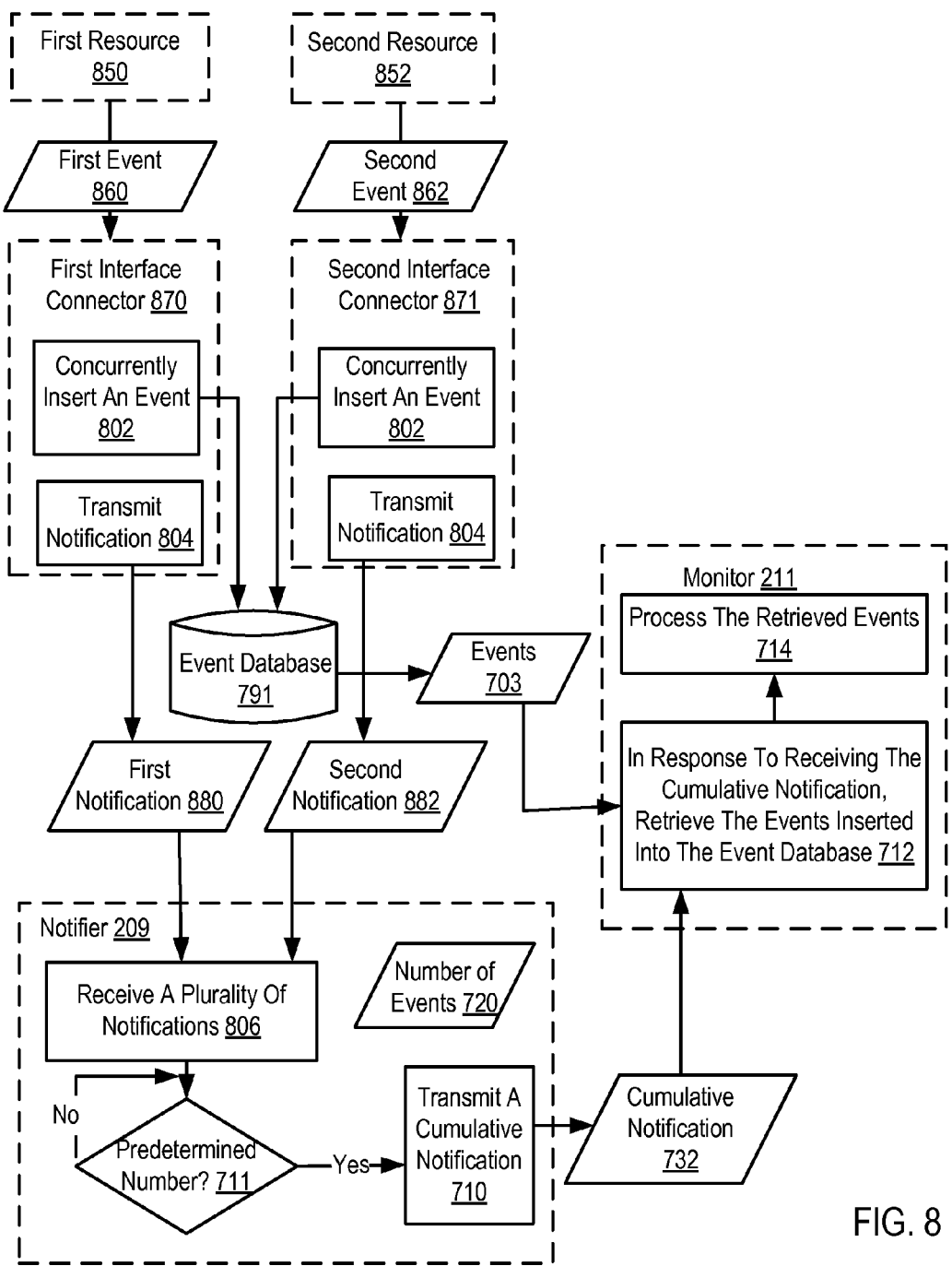
FIG. 8 sets forth a flow chart illustrating another exemplary method of flexible event data content management for relevant event and alert analysis within a distributed processing system according to embodiments of the present invention.

For further explanation, FIG. 8 sets forth a flow chart illustrating an additional method of flexible event data content management for relevant event and alert analysis within a distributed processing system according to embodiments of the present invention. The method of FIG. 8 is similar to the method of FIG. 7 in that the method of FIG. 8 includes: transmitting (710), by the notifier, a cumulative notification (732) indicating the number (720) of events that have been inserted into the event database (791); in response to receiving the cumulative notification (732), retrieving (712), by the monitor (211), from the event database (791), events (703) inserted into the event database (791); processing (714), by the monitor (211), the retrieved events (703).

In the example of FIG. 8, multiple interface connectors are coupled to resources and one notifier (209). A first interface connector (870) is configured to capture a first event (860) from a first resource (850) and transmit a first notification (880) to the notifier (209) in response to capturing the first event (860). A second interface connector (871) is configured to capture a second event (862) from a second resource (852) and transmit a second notification (882) to the notifier (209) in response to capturing the second event (862). The first interface connector (870) and the second interface connector (871) are configured to operate as the interface connector (207) of FIG. 2. The method of FIG. 8 includes inserting (802), by the plurality of interface connectors (870, 871), a plurality of events (860, 862) into the event database (791). That is, both interface connectors (870, 871) may concurrently insert events (860, 862) into the event database (791).

The method of FIG. 8 includes transmitting (804), by each of the interface connectors (870, 871) a notification (880, 882) indicating the insertion of the events (860, 862) into the event database (791). Transmitting (804) a notification (880, 882) indicating the insertion of the events (860, 862) into the event database (791) may be carried out by each of the interface connectors (870, 871) concurrently transmitting to the notifier (209) a separate notification on insertion of an event.

The method of FIG. 8 also includes receiving (806) from the plurality of interface connectors (870, 871), by the notifier (209), a plurality of notifications (880, 882) of insertions of the plurality of events (860, 862) into the event database (791). Receiving (806) from the plurality of interface connectors (870, 871) a plurality of notifications (880, 882) of insertions of the plurality of events (860, 862) into the event database (791) may be carried out by concurrently receiving separate notifications. In the method of FIG. 8, the cumulative notification transmitted by the notifier (209) and received by the monitor (211) may indicate some or all of the events indicated in the plurality of notifications received by the notifier. That is, the cumulative notification (732) may indicate insertions of multiple events, one or more of the events having been inserted into the event database (791) by a different interface connector.

Because the notification of the insertion into the event database is transmitted to the monitor (211) from the notifier (209), the event database (791) is able to focus on the insertion and querying of the events without responding to polling or processing triggers. Because the event database (791) does not have to respond to polling from the monitor (211) or triggers from the interface connectors (207), the ability of the event database (791) may be improved such that insertions of events by the interface connectors (207) are not lost.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as JAVA™, SMALLTALK™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of flexible event data content management for relevant event and alert analysis within a distributed processing system, the method comprising:

capturing, by each of a plurality of interface connectors, one or more events from a resource of the distributed processing system, wherein each of the one or more events is a notification of an error occurring in a component of the distributed computing system, wherein each event is identified by an event identifier, wherein each event identifier is unique such that no two interface connectors capture events with identical event identifiers;

inserting, by each of the plurality of interface connectors, one or more of the events into an event database, wherein no two interface connectors insert events with identical event identifiers into the event database;

receiving from the plurality of interface connectors, by a notifier, a notification of insertion of the event into the event database;

based on the received notification, tracking, by the notifier, the number of events indicated as inserted into the event database;

receiving from the notifier, by a monitor, a cumulative notification indicating the number of events that have been inserted into the event database;

in response to receiving the cumulative notification, retrieving, by the monitor, from the event database, events inserted into the event database;

processing, by the monitor, the retrieved events; and identifying, by the event analyzer, at least one alert based on the retrieved events.

2. The method of claim 1, wherein the cumulative notification is transmitted in response to the notifier determining that the number of events that have been inserted into the event database exceeds a predetermined number.

3. The method of claim 1, wherein the notifier is coupled to a plurality of interface connectors; the method further comprising:

inserting, by the plurality of interface connectors, a plurality of events into the event database; and receiving from the plurality of interface connectors, by the notifier, a plurality of notifications of insertions of the plurality of events into the event database;

wherein the cumulative notification received by the monitor indicates all of the events indicated in the plurality of notifications received by the notifier.

4. The method of claim 1, wherein each interface connector is configured to interface with a different resource of the distributed processing system.

5. The method of claim 1, wherein each interface connector uses a different notification class for transmitting notifications to the notifier.

6. The method of claim 1, wherein the monitor retrieves the event inserted into the event database without polling the event database.

7. The method of claim 1, wherein the monitor retrieves the event inserted into the event database without relying on a database trigger to detect the event captured at the interface connector.

8. The method of claim 1, wherein the cumulative notification is transmitted in response to the notifier determining that a predetermined amount of time has elapsed.

* * * * *